(12) United States Patent
Yanagitani et al.

(10) Patent No.: US 10,800,967 B2
(45) Date of Patent: Oct. 13, 2020

(54) CERAMIC COMPOSITION

(71) Applicant: Konoshima Chemical Co., Ltd., Osaka (JP)

(72) Inventors: Takagimi Yanagitani, Mitoyo (JP); Katsuhiro Muramatsu, Mitoyo (JP); Atsuko Endo, Mitoyo (JP); Kazunari Shiota, Mitoyo (JP)

(73) Assignee: Konoshima Chemical Co., Ltd., Osaka (JP)

( * ) Notice: Subject to any disclaimer, the term of this patent is extended or adjusted under 35 U.S.C. 154(b) by 0 days.

(21) Appl. No.: 16/466,260

(22) PCT Filed: Dec. 5, 2017

(86) PCT No.: PCT/JP2017/043611
§ 371 (c)(1),
(2) Date: Jun. 3, 2019

(87) PCT Pub. No.: WO2018/105598
PCT Pub. Date: Jun. 14, 2018

(65) Prior Publication Data
US 2020/0063029 A1  Feb. 27, 2020

(30) Foreign Application Priority Data
Dec. 7, 2016 (JP) .................. 2016-238048

(51) Int. Cl.
| C09K 11/02 | (2006.01) |
| C09K 11/77 | (2006.01) |
| C01F 17/00 | (2020.01) |
| H01L 33/50 | (2010.01) |
| H01L 33/58 | (2010.01) |
| C01F 17/206 | (2020.01) |
| C01F 17/34 | (2020.01) |

(52) U.S. Cl.
CPC .......... C09K 11/025 (2013.01); C01F 17/206 (2020.01); C01F 17/34 (2020.01); C09K 11/7774 (2013.01); H01L 33/502 (2013.01); H01L 33/58 (2013.01); C01P 2006/60 (2013.01)

(58) Field of Classification Search
CPC . C09K 11/025; C09K 11/7774; C01F 17/206; C01F 17/34; H01L 33/502; H01L 33/58; C01P 2006/60

USPC .......................................................... 257/98
See application file for complete search history.

(56) References Cited

U.S. PATENT DOCUMENTS

| 5,998,925 A | 12/1999 | Shimizu et al. |
| 6,417,127 B1* | 7/2002 | Yamamoto ............ C04B 35/115 501/127 |
| 2009/0009059 A1* | 1/2009 | Kwon ...................... H01J 11/42 313/503 |
| 2011/0210658 A1* | 9/2011 | Pan ......................... C04B 35/44 313/112 |
| 2016/0238922 A1* | 8/2016 | Furuyama ............ G03B 21/204 |
| 2017/0088774 A1* | 3/2017 | Asai .................... C04B 35/62685 |

FOREIGN PATENT DOCUMENTS

| JP | 2000-208815 A | 7/2000 |
| JP | 2001-147307 A | 5/2001 |
| JP | 2001-166110 A | 6/2001 |
| JP | 2001-174608 A | 6/2001 |
| JP | 2005-331707 A | 12/2005 |
| JP | 2009-13412 A | 1/2009 |
| JP | 2015-179719 A | 10/2015 |
| JP | 2015-215583 A | 12/2015 |
| JP | 5862841 B1 | 2/2016 |
| WO | WO 2015/141711 A1 | 9/2015 |

OTHER PUBLICATIONS

International Search Report for PCT/JP2017/043611 dated Feb. 6, 2018.
International Preliminary Report on Patentability for PCT/JP2017/043611 dated Jun. 11, 2019.

* cited by examiner

*Primary Examiner* — Tong-Ho Kim
(74) *Attorney, Agent, or Firm* — Knobbe, Martens Olson & Bear LLP

(57) ABSTRACT

Provided is a ceramic composition capable of achieving a light scattering function while maintaining optical properties at a high level. The ceramic composition comprises a fluorescence phase comprising a fluorescent material and a light-scattering phase comprising a lanthanum oxide. The lanthanum oxide may be, for example, at least one selected from $LaAlO_3$ and $La_2O_3$. The ratio of the fluorescent material (or the fluorescence phase) to the lanthanum oxide (or the light-scattering phase), the former/the latter, may be 99.9/0.1 to 50/50 in terms of volume ratio.

11 Claims, No Drawings

CERAMIC COMPOSITION

CROSS REFERENCE TO RELATED APPLICATIONS

This application is a U.S. National Phase Application of PCT International Application Number PCT/JP2017/043611, filed on Dec. 5, 2017, designating the United States of America and published in the Japanese language, which is an International Application of and claims the benefit of priority to Japanese Patent Application No. 2016-238048, filed on Dec. 7, 2016. The disclosures of the above-referenced applications are hereby expressly incorporated by reference in their entireties.

TECHNICAL FIELD

The present invention relates to a light-scattering agent comprising a lanthanum oxide and to a ceramic composition (ceramic material) comprising a lanthanum oxide as a light-scattering phase.

BACKGROUND ART

White LEDs (light-emitting diodes) have been produced by combining a blue LED with a yellow phosphor.

For example, Patent Literature 1 (JP 2000-208815 A) discloses a light-emitting diode capable of emitting white light. The light-emitting diode comprises a light-emitting element that comprises a light-emitting layer formed from a gallium nitride compound semiconductor on a substrate and is capable of emitting blue light, a coating provided on the light-emitting element, and a mold member protecting the coating. The coating contains a yellow photoluminescent phosphor that absorbs at least a part of the blue light from the light-emitting element to convert the wavelength, thus emitting fluorescence. The mold member contains a diffusion material to make the mold member milky white.

However, in such a white light-emitting diode, the mold member is necessarily formed from a transparent resin such as an epoxy resin or a silicone resin. This makes it difficult to control a uniform mixing state of the phosphor powder and the resin, a uniform thickness of the coating film, and the like, and thus the white LED is likely to have irregular colors/variation in color.

In addition, the transparent resin, which is required to encapsulate or be coated with a phosphor powder and is required to transmit a part of the blue light from the light source through the coating film without light conversion, is inferior in heat resistance and thus is likely to have a lower transmission rate due to degeneration by heat from the light-emitting element. Hence, this is a bottleneck for higher power white LEDs.

In such circumstances, a white LED using no resin has been studied. For example, Patent Literature 2 (JP 5862841 B) discloses a ceramic composite material for light conversion comprising a fluorescence phase and a transparent phase. The fluorescence phase comprises $Ln_3Al_5O_{12}$:Ce (Ln is at least one element selected from Y, Lu, and Tb; and Ce is an activation element), and the transparent phase comprises $LaAl_{11}O_{18}$.

CITATION LIST

Patent Literature

Patent Literature 1: JP 2000-208815 A
Patent Literature 2: JP 5862841 B

SUMMARY OF INVENTION

Technical Problem

An object of the present invention is to provide a novel light scattering material.

Another object of the present invention is to provide a novel ceramic composition having a light scattering function (light scattering property).

Solution to Problem

A blue LED emits light having high directivity, and when a phosphor has a high transmission rate, the image or the shadow of the back LED light source or a substrate is cast together with outgoing light to lead to irregular colors/variation in color.

Patent Literature 1 is intended to suppress such irregular colors/variation in color by providing the transparent phase, but has disadvantages including a lower internal quantum efficiency. The ceramic composite material according to Patent Literature 1 has many pores, which may cause unintended scattering to reduce the efficiency.

In order to solve such problems as irregular colors/variation in color, on the basis of a quite different concept from Patent Literature 1, the inventors of the present invention tried to combine a fluorescence phase and a scattering phase, but the scattering phase still caused a reduction in internal quantum efficiency and a variation in fluorescence wavelength, failing to give an intended emission color. It was thus extremely difficult to develop a ceramic capable of solving such problems and improving irregular colors/variation in color.

In such circumstances, in order to solve the problems, the inventors of the present invention further carried out intensive studies, and surprisingly found that when the scattering phase is made from a particular component (i.e., a lanthanum oxide), the fluorescence wavelength is maintained, and an intended fluorescence wavelength and a high internal quantum efficiency can be achieved. The present inventors conducted further examination and completed the present invention.

The present invention encompasses the following inventions and the like.

[1] A light-scattering agent comprising a lanthanum oxide.
[2] The light-scattering agent according to the above [1], wherein the lanthanum oxide is at least one selected from $LaAlO_3$ and $La_2O_3$.
[3] The light-scattering agent according to the above [1] or [2], for forming a ceramic composition in combination with a fluorescent material (phosphor).
[4] A ceramic composition comprising a fluorescence phase comprising a fluorescent material and a light-scattering phase comprising a lanthanum oxide.
[5] The composition according to the above [4], wherein the fluorescent material (fluorescence phase) has a garnet structure (garnet phase).
[6] The composition according to the above [4] or [5], wherein the lanthanum oxide (or the light-scattering phase) comprises at least one selected from $LaAlO_3$ and $La_2O_3$ at 50% by mass or more relative to a total amount of the lanthanum oxide (or the light-scattering phase).
[7] The composition according to any one of the above [4] to [6], wherein the ratio of average particle size in the fluorescence phase to average particle size in the light-scattering phase, former/latter, is 100/1 to 1/1.

[8] The composition according to any one of the above [4] to [7], wherein the ratio of the fluorescent material (or the fluorescence phase) to the lanthanum oxide (or the light-scattering phase), former/latter, is 99.9/0.1 to 50/50 in terms of volume ratio.

[9] The composition according to any one of the above [4] to [8], wherein the composition comprises a fluorescence phase comprising a fluorescent material containing an yttrium garnet compound doped with an activator and comprises a light-scattering phase comprising a lanthanum oxide containing at least one selected from $LaAlO_3$ and $La_2O_3$ at 80% by mass or more relative to a total amount of the lanthanum oxide (or the light-scattering phase), the ratio of the fluorescent material to the lanthanum oxide, former/latter, is 99.9/0.1 to 70/30 in terms of volume ratio, and the ratio of average particle size in the fluorescence phase to average particle size in the light-scattering phase, former/latter, is 15/1 to 1.2/1.

[10] The composition according to any one of the above [4] to [9], having a linear transmission rate of 5% or less at a thickness of 2 mm and at a wavelength of 530 nm.

[11] The composition according to any one of the above [4] to [10], having a difference in main fluorescence wavelength, A2−A1, of −5 nm to 5 nm, where A1 is a main fluorescence wavelength without the lanthanum oxide (or the light-scattering phase), and A2 is a main fluorescence wavelength with the lanthanum oxide (or the light-scattering phase).

[12] The composition according to any one of the above [4] to [11], having an internal quantum efficiency ratio, B2/B1, of 0.93 or more, where B1 is an internal quantum efficiency without the lanthanum oxide (or the light-scattering phase), and B2 is an internal quantum efficiency with the lanthanum oxide (or the light-scattering phase).

[13] The composition according to any one of the above [4] to [12], having a linear transmission rate of 3.5% or less (for example, 3% or less) at a thickness of 2 mm and at a wavelength of 530 nm, a difference in main fluorescence wavelength, A2−A1, of −3 nm to 3 nm, where A1 is a main fluorescence wavelength without the lanthanum oxide (or the light-scattering phase), and A2 is a main fluorescence wavelength with the lanthanum oxide (or the light-scattering phase), and an internal quantum efficiency ratio, B2/B1, of 0.95 or more, where B1 is an internal quantum efficiency without the lanthanum oxide (or the light-scattering phase), and B2 is an internal quantum efficiency with the lanthanum oxide (or the light-scattering phase).

[14] A light-emitting device comprising a light-emitting element and (a light-emitting unit, a light conversion unit composed of) the ceramic composition according to any one of the above [4] to [13].

Advantageous Effects of Invention

According to the present invention, a novel light scattering material (a light-scattering agent, a light diffusing agent) can be provided.

According to the present invention, a novel ceramic composition (composite ceramic composition) having a light scattering function (light scattering property) can be provided.

The ceramic composition (or a light scattering material) comprises a base ceramic (for example, a fluorescent material) and a lanthanum oxide (or a light-scattering agent) and has a light scattering property. Hence, the ceramic composition can diffuse incident light into a wide viewing angle before emitting the light to the outside and can suppress or prevent irregular colors/variation in color of light, for example, from an LED (such as a blue LED).

The ceramic composition having a light scattering function typically does not have impaired optical properties, and the function of the base ceramic is maintained at a high level. For example, the ceramic composition of the present invention can maintain the fluorescence wavelength of the fluorescence phase (fluorescent material) probably because the fluorescence phase and the scattering phase do not enter each other, and can efficiently provide light in an intended color.

In addition, the ceramic composition of the present invention comprises the scattering phase, but very surprisingly, the luminous efficiency can be prevented from deteriorating, and moreover, the internal quantum efficiency can be maintained at the same level or be further improved.

The composition of the present invention is a ceramic, eliminating the use of a resin or the like, and has no variation in transparency.

DESCRIPTION OF EMBODIMENTS

Light-Scattering Agent

A light-scattering agent (a light scattering material, a light diffusing agent) of the present invention comprises a lanthanum oxide.

The lanthanum oxide may be any oxide containing lanthanum (La) and may comprise additional elements (for example, Group 13 elements (such as aluminum) and rare earth elements (such as Y and Lu)). The additional elements may be contained singly or as a combination of two or more of them in the lanthanum oxide.

Specific examples of the lanthanum oxide include $LaAlO_3$, lanthanum-containing garnets (such as $La_3Al_5O_{12}$), $La_2O_3$, and $LaAl_{11}O_{18}$. These lanthanum oxides may be used singly or in combination of two or more of them.

Preferred lanthanum oxides are $LaAlO_3$ (LAP) and $La_2O_3$, and particularly preferred is $LaAlO_3$. Hence, the lanthanum oxide may particularly comprise at least one selected from $LaAlO_3$ and $La_2O_3$.

In such a case, the proportion of the at least one selected from $LaAlO_3$ and $La_2O_3$ relative to the total amount of the lanthanum oxide may be, for example, 30% by mass or more, preferably 50% by mass or more, more preferably 80% by mass or more, particularly 85% by mass or more, and particularly preferably 90% by mass or more, and substantially, the lanthanum oxide may comprise only the at least one selected from $LaAlO_3$ and $La_2O_3$ (for example, at 95% by mass or more).

The lanthanum oxide may be in a calcined state depending on the application.

The average particle size of the lanthanum oxide depends on the intended purpose as the light-scattering agent or the like, but may be, for example, about 0.001 to 100 μm, preferably 0.01 to 50 μm, more preferably 0.05 to 20 μm, and particularly 0.1 to 10 μm, and may be about 0.05 to 5 μm (for example, 0.1 to 1 μm).

The average particle size may be a secondary particle size. The average particle size can be determined, for example, by laser scattering. For example, the average particle size may be the particle size at an accumulation of 50% in a wet particle size distribution.

The lanthanum oxide may have a specific surface area (BET specific surface area) of, for example, 0.1 to 100 m$^2$/g, preferably 0.5 to 60 m$^2$/g, and more preferably 1 to 50 m$^2$/g (for example, 3 to 30 m$^2$/g)

As the lanthanum oxide, a commercial product or a produced lanthanum oxide may be used. The production method of the lanthanum oxide can be appropriately selected depending on the type of the lanthanum oxide, and a common method can be used without particular limitation.

For example, the lanthanum oxide may be prepared by subjecting a lanthanum oxide source (for example, a lanthanum salt, a combination of a lanthanum salt and an aluminum salt, or a carbonate of lanthanum) to heat treatment (burning, calcination) in the presence of oxygen.

The heat treatment temperature may be, for example, 500° C. or more (for example, 600 to 2,000° C.), preferably 800° C. or more (for example, 900 to 1,800° C.), and more preferably 1,000° C. or more (for example, 1,100 to 1,500° C.).

The light-scattering agent comprises the lanthanum oxide and may further comprise additional components as long as advantageous effects of the present invention are not impaired. When the light-scattering agent comprises an additional component, the proportion of the light-scattering agent relative to the total amount of the light-scattering agent may be, for example, 50% by mass or more, preferably 70% by mass or more, more preferably 80% by mass or more, and particularly 90% by mass or more, and the light-scattering agent may comprise substantially only the lanthanum oxide (for example, at 95% by mass or more).

The light-scattering agent (or the lanthanum oxide) of the present invention may be used in any application as long as the agent can be used for light scattering, and examples of the application include an application for forming a ceramic and an application for forming a dispersion in which the light-scattering agent is dispersed together with a light-emitting material (such as a fluorescent material) in an appropriate binder (for example, a binder resin such as an epoxy resin).

Typically, the light-scattering agent of the present invention may be used as a light-scattering agent (an additive) for forming a ceramic composition (a ceramic composite, a multiphase ceramic composition) in combination with a base ceramic (or a ceramic material, for example, a fluorescent material).

In particular, when the light-scattering agent of the present invention is combined with a fluorescent material to form a ceramic, the above-mentioned effects are achieved, and thus such an application is preferred.

Hence, such a ceramic composition comprising a fluorescent material as a base ceramic will be described in detail.
Ceramic Composition A ceramic composition of the present invention (a composite ceramic, a ceramic composite) comprises a fluorescent material and a lanthanum oxide (or a light-scattering agent).
(Fluorescent Material)

The fluorescent material (phosphor) is not particularly limited and can be appropriately selected depending on the intended color or the like.

For example, the fluorescent material may be a yellow fluorescent material (a material emitting yellow light). When such a yellow fluorescent material is used in combination with blue light (a blue LED), white light can be efficiently obtained.

The fluorescent material may comprise an inorganic compound having a garnet structure (a garnet compound, a garnet type compound).

The garnet structure is represented, for example, by a composition formula of $A_3B_5O_{12}$. Each of A and B is a trivalent element. In such a garnet structure, examples of the element A include rare earth elements (such as Y, Gd, Lu, and Tb). Examples of the element B include Group 13 elements (such as Al, Ga, and In).

The elements A and B each may be used singly or in combination of two or more of them to form a garnet type compound.

The fluorescent material may have a perovskite structure (as the crystal structure of the fluorescent material).

Specific examples of the fluorescent material include $Y_3Al_5O_{12}$ (YAG), $(Y,Gd)_3Al_5O_{12}$, $(Y,Tb)_3Al_5O_{12}$, $(Y,Gd)_3(Al,Ga)_5O_{12}$, $LuAl_5O_{12}$, $(Sr,Ca,Ba)_2SiO_4$, $Ca_3Sc_2Si_3O_{12}$, $Ba_3MgSi_2O_8$, $BaMgAl_{10}O_{17}$, $La_2O_2S$, $SrGa_2S_4$, $CaAlSiN_3$, $Ca_2Si_5N_8$, and CaSiAlON.

Of them, garnet compounds, for example, yttrium-containing garnet compounds (including garnet compound containing yttrium (Y) but not containing lanthanum (La)) such as $Y_3Al_5O_{12}$ (YAG), $(Y,Gd)_3Al_5O_{12}$, $(Y,Tb)_3Al_5O_{12}$, and $(Y,Gd)_3(Al,Ga)_5O_{12}$ are preferred.

The fluorescent material may comprise (may be doped with) an activator. Examples of the activator (impurity) include rare earth elements (such as Ce, Pr, Nd, Eu, Tb, Ho, Er, Tm, and Yb) and other transition elements (such as Cr). The activators may be used singly or in combination of two or more of them.

Specific examples of the activator-containing fluorescent material include a fluorescent material in which the above fluorescent material is doped with an activator (a rare earth element), such as $Y_3Al_5O_{12}$:Ce (or $(Y,Ce)_3Al_5O_{12}$, the same applies hereinafter), $(Y,Gd)_3Al_5O_{12}$:Ce, $(Y,Tb)_3Al_5O_{12}$:Ce, $(Y,Gd)_3(Al,Ga)_5O_{12}$:Ce, $LuAl_5O_{12}$:Ce, $(Sr,Ca,Ba)_2SiO_4$:Eu, $Ca_3Sc_2Si_3O_{12}$:Ce, $Ba_3MgSi_2O_8$:Eu, $BaMgAl_{10}O_{17}$:Eu, $La_2O_2S$:Eu, $SrGa_2S_4$:Eu, $CaAlSiN_3$:Eu, $Ca_2Si_5N_8$:Eu, and CaSiAlON:Eu.

Of them, garnet type fluorescent materials, for example, activator-containing yttrium garnet compounds (including garnet type compounds containing yttrium (Y) but not containing lanthanum (La)) such as $Y_3Al_5O_{12}$:Ce, $(Y,Gd)_3Al_5O_{12}$:Ce, $(Y,Tb)_3Al_5O_{12}$:Ce, and $(Y,Gd)_3(Al,Ga)_5O_{12}$:Ce are preferred.

In the Y-containing garnet type compound (fluorescent material), the proportion of Y relative to the total rare earth elements (for example, A in the composition) may be, for example, 50% by mole or more, preferably 70% by mole or more (for example, 80% by mole or more), and more preferably 90% by mole or more.

When the Y-containing garnet type compound (fluorescent material) contains Y and another rare earth element (for example, Gd), the ratio thereof, the former/the latter (molar ratio), may be about 99.99/0.01 to 50/50, preferably 99.9/0.1 to 70/30, and more preferably 99.5/0.5 to 80/20 (for example, 99/1 to 85/15).

In the activator-containing fluorescent material, the proportion of the activator (such as a rare earth element) relative to the total constituent elements of the fluorescent material may be, for example, 3% by mole or less (for example, 0.00001 to 2.5% by mole), preferably 2% by mole or less (for example, 0.0001 to 1.5% by mole), more preferably 1% by mole or less (for example, 0.001 to 0.9% by mole), particularly 0.5% by mole or less, and particularly preferably 0.1% by mole or less.

In particular, in the activator-containing garnet compound (the garnet compound doped with the activator), the proportion of the activator in the total rare earth elements (for example, the proportion of Ce to the total amount of Y and Ce in $Y_3Al_5O_{12}$:Ce) may be, for example, 5% by mole or less (for example, 0.00001 to 4% by mole), preferably 3% by mole or less (for example, 0.0001 to 2.5% by mole), more preferably 1% by mole or less (for example, 0.001 to 0.9% by mole), and particularly 0.5% by mole or less.

The fluorescent materials may be used singly or in combination of two or more of them.

(Lanthanum Oxide (or Light-Scattering Agent))

As the lanthanum oxide (or the light-scattering agent), the above exemplified lanthanum oxides (for example, a lanthanum oxide comprising at least one selected from $LaAlO_3$ and $La_2O_3$) can be used.

In the ceramic composition of the present invention, the ratio of the fluorescent material (or the fluorescence phase described later) to the lanthanum oxide (or the light-scattering phase described later), the former/the latter (volume ratio), can be selected, for example, from a range of about 99.99/0.01 to 20/80 (for example, 99.95/0.05 to 20/80), may be 99.9/0.1 to 20/80 (for example, 99.5/0.5 to 30/70), preferably 99/1 to 40/60 (for example, 99/1 to 50/50), and more preferably 98/2 to 60/40 (for example, 97/3 to 70/30), and may be typically about 99.9/0.1 to 70/30.

In the present invention, only a slight amount of lanthanum oxide (for example, in the cases where the upper limit of the lanthanum oxide ratio in terms of fluorescent material/lanthanum oxide (volume ratio) is 99.9/0.1, 99.8/0.2, 99.5/0.5, 99/1, 98/2, 97/3, 96.5/3.5, 96/4, 95/5, or the like), can achieve a light scattering property.

From the viewpoint of achieving sufficient light scattering property, the rate of the lanthanum oxide can be set to a particular value (for example, the lower limit of the lanthanum oxide rate in terms of fluorescent material/lanthanum oxide (volume ratio) may be 99.9/0.1, 99.5/0.5, 99/1, 98/2, 97/3, 96.5/3.5, 96/4, 95/5, or the like).

(Phase Structure and the Like)

In the ceramic composition of the present invention, the fluorescent material and the lanthanum oxide (or the light-scattering agent) may be present in any form, and the composition may typically have a multiphase structure (a polycrystal, a polycrystalline structure) having a phase comprising the fluorescent material (a fluorescence phase) and a phase comprising the lanthanum oxide (a light-scattering phase).

In such a ceramic composition, typically, the phase comprising the lanthanum oxide has a light scattering (light diffusing) function.

In the ceramic composition (or the light-scattering agent) of the present invention, the light scattering (function) may mean (such a function) that, for example, incident light (incident light on the ceramic composition) and/or fluorescence (fluorescence from the fluorescent material) is scattered or diffused (scattered or diffused into a wider viewing angle) before being emitted (to the outside (out of the ceramic composition)). As described above, the light-scattering phase has a quite different function from that of the transparent phase in Patent Literature 1 or the like.

In the ceramic composition comprising the fluorescence phase and the light-scattering phase, the ratio of the fluorescence phase to the light-scattering phase can be selected from a similar range to the above, and the former/the latter (volume ratio) may be 99.9/0.1 to 20/80 (for example, 99.5/0.5 to 30/70), preferably 99/1 to 40/60 (for example, 99/1 to 50/50), and more preferably 98/2 to 60/40 (for example, 97/3 to 70/30), and may be typically 99/1 to 70/30.

Each of the fluorescence phase and the light-scattering phase may be present in a particulate form (an island, crystal, or crystal grain form).

Among particles (in gaps of particles) of one phase, particles of the other phase may be present. In the ceramic composition of the present invention, typically, among fluorescence phases (particulate fluorescence phases), a light-scattering phase (a particulate light-scattering phase) may be present.

Among particles, gaps (cavities, voids, or pores) may be present, but the ceramic composition of the present invention typically has relatively fewer gaps among particles. The gaps among particles are typically small. In other words, the ceramic composition of the present invention typically has a structure in which particles densely aggregate with smaller gaps at the interfaces between particles.

For example, the proportion of the area of pores (or portions other than the fluorescence phase and the light-scattering phase) relative to the total cross-sectional area of the ceramic composition of the present invention may be 10% or less (for example, 5% or less), preferably 3% or less (for example, 2% or less), more preferably 1% or less (for example, 0.5% or less), and particularly 0.1% or less (for example, 0.05% or less).

In the ceramic composition of the present invention, the average distance between the particles (average width of the grain boundaries or crystal grain boundaries) is extremely small, and may be, for example, 10 nm or less, preferably 5 nm or less, and more preferably 1 nm or less.

The average particle sizes (average crystal sizes) in the particulate phases (the fluorescence phase and the light-scattering phase) are not particularly limited, and each may be, for example, about 0.001 μm or more (for example, 0.01 to 100 μm), preferably 0.05 μm or more (for example, 0.1 to 60 μm), and more preferably 0.3 μm or more (for example, 0.5 to 50 μm), and may be typically 0.1 to 30 μm (for example, 0.5 to 10 μm, preferably 1 to 5 μm).

The ratio of the average particle size (average crystal size) in the fluorescence phase to the average particle size (average crystal size) in the light-scattering phase (particle size ratio), the former/the latter (the average particle size in the fluorescence phase/the average particle size in the light-scattering phase), may be, for example, about 500/1 to 0.1/1 (for example, 50/1 to 0.5/1), preferably 30/1 to 0.7/1, more preferably 10/1 to 1/1 (for example, 8/1 to 1.2/1), and particularly 5/1 to 1.3/1 (for example, 4/1 to 1.5/1), and may be typically 100/1 (for example, 50/1 to 1/1, preferably 30/1 to 1.1/1, more preferably 15/1 to 1.2/1).

The average particle size (average crystal size) can be determined (defined) in accordance with the following formula, for example.

$$\text{Average particle size} = 1.56C/(MN)$$

(In the formula, C is the length of an arbitrary line (straight line) in a high resolution image such as an SEM image; N is the number of particles on the line; and M is a scaling factor.)

The ceramic composition of the present invention comprises the fluorescent material (or the fluorescence phase) and the lanthanum oxide (or the light-scattering phase) and may comprise additional components (components included in neither the concept of the fluorescent material nor the concept of the lanthanum oxide) as long as advantageous effects of the present invention are not impaired. Such an additional component may be present in the fluorescent material (or the fluorescence phase) and/or in the lanthanum oxide (the light-scattering phase), may be independently present, and may be present in a combined state of them.

When such an additional component is contained, the proportion of the additional component in the ceramic composition may be, for example, 10% by volume or less, preferably 5% by volume or less, and more preferably 1% by volume or less, and may be 0.1% by volume or less.

The thickness (average thickness) of the ceramic composition of the present invention can be appropriately selected depending on the application (intended color and the like). The thickness may be, for example, about 1 μm to 10 mm, preferably 10 μm to 5 mm, more preferably 20 to 3,000 μm (for example, 50 to 2,000 μm), and may be 1,000 μm or less (for example, 1 to 500 μm, preferably 10 to 300 μm, more preferably 30 to 200 μm).

The ceramic composition of the present invention typically has a light scattering function and thus has a low linear light transmittance. For example, the linear transmission rate at a wavelength of 530 nm of the ceramic composition having a thickness of 2 mm may be, for example, 10% or less (for example, 7% or less), preferably 5% or less (for example, 4% or less), more preferably 3% or less (for example, 2% or less), and particularly 1% or less (for example, 0.5% or less, 0.4% or less, 0.35% or less, 0.3% or less), and may be typically 3.5% or less (for example, 3.3% or less).

The linear transmission rate can be determined by using a spectrophotometer, for example.

The ceramic composition of the present invention comprises the fluorescent material and the lanthanum oxide, but typically has little invasion therebetween, and can reflect fluorescence wavelengths at high accuracy. For example, in the ceramic composition of the present invention, when the main fluorescence wavelength without the lanthanum oxide (or the light-scattering phase) is A1, and the main fluorescence wavelength with the lanthanum oxide (or the light-scattering phase) is A2, the difference in main fluorescence wavelength, A2−A1, may be −7 nm to 7 nm, preferably −5 nm to 5 nm, more preferably −3 nm to 3 nm, particularly −2 nm to 2 nm (for example, −1 nm to 1 nm), and particularly preferably −0.5 nm to 0.5 nm, and may be 0 nm.

The fluorescence wavelength of the ceramic composition of the present invention can be appropriately selected depending on the intended color or the like, and the main fluorescence wavelength may be, for example, about 400 nm or more (for example, 450 to 600 nm), and may be particularly about 520 to 590 nm (for example, 530 to 580 nm).

The ceramic composition of the present invention comprises the lanthanum oxide as the light-scattering agent but can achieve luminous efficiency at a high level. For example, in the ceramic composition of the present invention, when the internal quantum efficiency without the lanthanum oxide (or the light-scattering phase) is B1, and the internal quantum efficiency with the lanthanum oxide (or the light-scattering phase) is B2, the internal quantum efficiency ratio, B2/B1, may be about 0.90 or more (for example, 0.91 or more), preferably 0.92 or more (for example, 0.93 or more), more preferably 0.94 or more (for example, 0.95 or more), particularly 0.96 or more (for example, 0.97 or more), and particularly preferably 0.98 or more (for example, 0.99 or more), and can be 1 or more (for example, more than 1 (for example, 1.0005 or more, preferably 1.001 or more)).

(Production Method)

The method for producing the ceramic composition of the present invention is not particularly limited. For example, the ceramic composition can be produced by subjecting a composition comprising the fluorescent material and the lanthanum oxide (a precursor composition, a ceramic precursor composition) to burning treatment (sintering treatment).

As the fluorescent material, a commercial product or a produced material may be used. The method for producing the fluorescent material can be appropriately selected depending on the type of the fluorescent material or the like and is not particularly limited, and a common method can be used.

For example, the fluorescent material can be prepared by subjecting fluorescent material sources (for example, an yttrium salt, an aluminum salt, and, as needed, a rare earth element salt (such as a cerium salt)) to heat treatment (burning, calcination) in the presence of oxygen.

The heat treatment temperature may be, for example, 500° C. or more (for example, 600 to 2,000° C.), preferably 800° C. or more (for example, 900 to 1,800° C.), and more preferably 1,000° C. or more (for example, 1,100 to 1,500° C.).

The fluorescent material (the fluorescent material to be subjected to burning, a material powder of the fluorescent material, a precursor of the fluorescent material) may be in a calcined state, depending on the application.

The average particle size of the fluorescent material (the fluorescent material to be subjected to burning) may be, for example, about 0.001 to 100 μm, preferably 0.01 to 50 μm, more preferably 0.05 to 20 μm, and particularly 0.1 to 10 μm, and may be about 0.05 to 5 μm (for example, 0.1 to 1 μm).

The average particle size may be a secondary particle size. The average particle size can be determined, for example, by laser scattering. For example, the average particle size may be the particle size at an accumulation of 50% in a wet particle size distribution.

The fluorescent material (the fluorescent material to be subjected to burning) may have a specific surface area (BET specific surface area) of, for example, 0.1 to 100 m$^2$/g, preferably 0.5 to 60 m$^2$/g, and more preferably 1 to 50 m$^2$/g (for example, 3 to 30 m$^2$/g).

As the lanthanum oxide (the lanthanum oxide to be subjected to burning, a material powder or precursor of the lanthanum oxide in the ceramic composition), a commercial product or a lanthanum oxide produced, for example, by the method described in the section of the light scattering source may be used. The lanthanum oxide may be in a calcined state as described above, and the average particle size and the BET specific surface area of the lanthanum oxide can be selected from similar ranges to the above. In other words, the light-scattering agent may be used as the material or the precursor of the ceramic composition of the present invention.

The ceramic precursor composition may comprise additional components (for example, a binder (resin), a dispersant, and a sintering agent). The additional components may be used singly or in combination of two or more of them.

The ceramic precursor composition can be prepared by mixing the fluorescent material and the lanthanum oxide (and additional components, as needed). The mixing can be performed in the presence of a solvent (such as water) and can be performed in combination with pulverization.

The ceramic precursor composition may be molded into an appropriate shape (for example, a sheet shape) depending on the application or the like. The molding method is not particularly limited, and examples include CIP (cold isostatic press) molding and press molding. These molding methods may be used in combination of two or more of them.

The ceramic precursor composition may be subjected to defatting treatment before burning. The defatting treatment can be performed, for example, by heat treatment in the presence of oxygen at a predetermined temperature (for example, 300 to 1,000° C., preferably 500 to 900° C., more preferably 600 to 850° C.).

The burning treatment may be performed in an inert atmosphere (for example, under vacuum). In the burning treatment, the burning temperature may be, for example, about 800° C. or more (for example, 900 to 3,000° C.), preferably about 1,000° C. or more (for example, 1,100 to 2,500° C.), more preferably about 1,200° C. or more (for example, 1,300 to 2,200° C.), and particularly about 1,500° C. or more (for example, 1,600 to 2,000° C.).

In the burning treatment, the rate of temperature increase or the degree of vacuum can be appropriately selected. The burning time can also be appropriately selected and may be, for example, 30 minutes or more (for example, 40 minutes to 12 hours) and preferably 1 hour or more (for example, 1.5 to 6 hours).

After the sintering, annealing treatment may be further performed as needed.

Light-Emitting Device

The ceramic composition of the present invention can be used as a component of a light-emitting device, for example. Such a light-emitting device may comprise, for example, a light-emitting element and the ceramic composition (or a light-emitting unit and a light conversion unit composed of the ceramic composition).

The light-emitting element is not particularly limited and may be typically a light-emitting diode element. The light-emitting diode element can be selected depending on the intended color or the like and may be a blue diode element, for example. The peak wavelength of the light-emitting element can be selected depending on the type of the fluorescent material and the intended color and may be, for example, 550 nm or less (for example, 400 to 520 nm, preferably 420 to 500 nm).

EXAMPLES

The present invention will next be described in further detail with reference to examples, but the present invention is not limited by the examples, and many modifications can be made within the technical idea of the present invention by a person skilled in the art.

Various structures and physical properties (characteristics) were determined or evaluated by the following procedures.

Crystal Phase

The crystal phase of each sintered compact was identified from an X-ray diffraction spectrum recorded with an X-ray diffractometer (RINT-2500V manufactured by Rigaku).

Linear Transmission Rate

Each sintered compact obtained was subjected to machining to have a thickness of 1 mm and was subjected to double-side mirror polishing by using a diamond slurry.

The transmission rate of the polished product was determined with a spectrophotometer (U-4100 manufactured by Hitachi, Ltd.) as a linear transmission rate at a wavelength of 530 nm.

Specific Surface Area

A measurement sample (material powder) pretreated with an octuplet-type preheating unit (manufactured by MOUNTECH) in a nitrogen gas atmosphere at about 130° C. for about 30 minutes was subjected to measurement by the nitrogen gas adsorption method with a BET specific surface area measurement device such as Macsorb HM Model-1208 (manufactured by MOUNTECH).

Average Particle Size (Material Average Secondary Particle Size)

As a pretreatment, 2.0 g of a sample powder was placed in a 100-mL beaker, and SOLMIX was added to give a total volume of 50 mL. The whole was dispersed with an ultrasonic homogenizer (UD-201 manufactured by Tomy Seiko) for 3 minutes. Immediately after the completion of dispersion, the whole mixture was transferred into a circulator (Microtrac VSR manufactured by MicrotracBEL), and the wet particle size distribution was determined with a particle size analyzer (Microtrac HRA manufactured by MicrotracBEL). The particle size at an accumulation of 50% in the wet particle size distribution was regarded as the average particle size.

Average Particle Size (Sintered Compact)

Each sintered compact was planarized by machining and then was subjected to double-side mirror polishing with a diamond slurry.

The sintered compact after mirror polishing was heated at 1,300° C. for 2 hours in the air to undergo grain boundary corrosion.

On a sintered compact having the multiphase structure, a crystal grain structure having different contrasts was observed, whereas on a sintered compact having the single-phase structure, a single crystal grain structure was observed.

From elementary analysis, in a sintered compact having the multiphase structure, the crystal grains having a brighter contrast were identified as a scattering material phase (LAP phase), and the crystal grains having a darker contrast were identified as a fluorescent material phase (garnet phase), whereas a sintered compact having the single-phase structure was identified as a fluorescent material phase (garnet phase).

An SEM image was recorded for the average particle size, and the average particle size (average crystal size) was calculated in accordance with the following formula.

$$\text{Average particle size} = 1.56C/(MN)$$

(In the formula, C is the length of an arbitrary line (straight line) in an SEM image; N is the number of particles on the line; and M is a scaling factor)

Internal Quantum Efficiency

The main fluorescence wavelength and the internal quantum efficiency of a fluorescent material were measured and calculated with the QE-2000 solid quantum efficiency measurement system manufactured by Otsuka Electronics by the following procedure.

A part of the sintered compact was processed into dimensions, 10×10×0.2 mm, and the sample was set in the system. An excitation light spectrum and a fluorescence spectrum at an excitation wavelength of 460 nm were recorded, and simultaneously, the internal quantum efficiency was determined.

Example 1: Ce:YAG+Scattering Source LAP Fluorescent Material (Ce 0.15%:YAG)

First, 14.98 L of a 0.5 mol/L aqueous solution of high-purity (99.99% or more in terms of rare earth element, the same applies hereinafter) yttrium chloride, 0.02 L of a 0.5 mol/L aqueous solution of high-purity cerium nitrate, and 25

L of a 0.5 mol/L aqueous solution of high-purity aluminum chloride were mixed to give a mixed solution having a garnet (YAG) composition formula.

Into 40 L of a 2 mol/L aqueous solution of ammonium hydrogen carbonate adjusted with an aqueous ammonia to have a pH of 8.2, the mixed solution having the YAG composition formula was added dropwise at a speed of 1.5 L/min. During the dropwise addition, both the mixed solution having the YAG composition formula and the aqueous solution of ammonium hydrogen carbonate were maintained at 32° C.

After the completion of the dropwise addition, the mixture was aged at 32° C. for 48 hours, then filtered, and washed with water 6 times, giving a YAG precursor. The resulting YAG precursor was calcined in the atmosphere at 1,200° C. for 5 hours and then was pulverized to give a material powder.

The powder had a BET specific surface area of 12.2 $m^2/g$ and an average particle size (secondary particle size) of 0.26 μm by laser scattering. Aggregated particles having a size of 2 μm or more were not observed.

Light-Scattering Agent (LAP)

First, 15 L of a 0.5 mol/L aqueous solution of high-purity lanthanum chloride and 15 L of a 0.5 mol/L aqueous solution of high-purity aluminum chloride were mixed to give a mixed solution having a LAP ($LaAlO_3$) composition formula.

Into 40 L of a 2 mol/L aqueous solution of ammonium hydrogen carbonate adjusted with an aqueous ammonia to have a pH of 8.2, the mixed solution having the LAP composition formula was added dropwise at a speed of 1.5 L/min. During the dropwise addition, both the mixed solution having the LAP composition formula and the aqueous solution of ammonium hydrogen carbonate were maintained at 32° C.

After the completion of the dropwise addition, the mixture was aged at 32° C. for 48 hours, then filtered, and washed with water 6 times, giving an LAP precursor. The resulting LAP precursor was calcined in the atmosphere at 1,200° C. for 5 hours and then was pulverized to give a material powder.

The powder had a BET specific surface area of 11.9 $m^2/g$ and an average particle size (secondary particle size) of 0.20 μm by laser scattering. Aggregated particles having a size of 2 μm or more were not observed.

Molding

Together with organic components (manufactured by Chukyo Yushi, "Celuna D305" (dispersant), "Celuna WF-804" (binder), and "Selosol A" (modifying agent)), the Ce:YAG material powder and the LAP material powder were added at a volume ratio of 80:20, and the mixture was pulverized and mixed for about 20 hours by using a nylon pot and a nylon ball, giving an aqueous slurry.

The resulting slurry was dried in a dryer and was sufficiently pulverized by using a mortar. The powder was next subjected to primary molding with a φ20-mm mold and then was subjected to CIP molding at a pressure of 2 t.

Burning

The resulting molded article was heated in an oxygen stream at a temperature increase rate of 30° C./hr and defatted at 750° C. for 100 hours. The density of the molded article after defatting was 61.2% relative to the theoretical density.

The molded article after defatting was burned in a vacuum furnace at a temperature of 1,700° C. for 2 hours, giving a sintered compact (ceramic). The temperature increase rate was 400° C./hr, and the degree of vacuum was $10^{-3}$ Torr or less.

SEM and TEM observation of the resulting sintered compact revealed that particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 2: Ce:(Y,Gd)AG+Scattering Source LAP

Molding and burning were performed in the same manner as in Example 1 except that the fluorescent material (Ce:(Y, Gd)AG) prepared by the following method was used in place of the fluorescent material in Example 1, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Fluorescent Material (Ce 0.15% Gd 7% YAG)

First, 13.93 L of a 0.5 mol/L aqueous solution of high-purity yttrium chloride, 0.02 L of a 0.5 mol/L aqueous solution of high-purity cerium nitrate, 1.05 L of a 0.5 mol/L aqueous solution of high-purity gadolinium chloride, and 25 L of a 0.5 mol/L aqueous solution of high-purity aluminum chloride were mixed to give a mixed solution having a garnet composition formula.

Into 40 L of a 2 mol/L aqueous solution of ammonium hydrogen carbonate adjusted with an aqueous ammonia to have a pH of 8.2, the mixed solution having the YAG composition formula was added dropwise at a speed of 1.5 L/min. During the dropwise addition, both the mixed solution having the YAG composition formula and the aqueous solution of ammonium hydrogen carbonate were maintained at 32° C.

After the completion of the dropwise addition, the mixture was aged at 32° C. for 48 hours, then filtered, and washed with water 6 times, giving a YAG precursor. The resulting YAG precursor was calcined in the atmosphere at 1,200° C. for 5 hours and then was pulverized to give a material powder.

The powder had a BET specific surface area of 11.6 $m^2/g$ and an average particle size (secondary particle size) of 0.28 μm by laser scattering. Aggregated particles having a size of 2 μm or more were not observed.

Example 3: Ce:YAG+Scattering Source $La_2O_3$

Molding and burning were performed in the same manner as in Example 1 except that the light-scattering agent ($La_2O_3$) prepared by the following method was used in place of the light-scattering agent in Example 1, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Light-Scattering Agent ($La_2O_3$)

First, 30 L of a 0.5 mol/L aqueous solution of high-purity lanthanum chloride was prepared.

Into 40 L of a 2 mol/L aqueous solution of ammonium hydrogen carbonate adjusted with an aqueous ammonia to have a pH of 8.2, the aqueous solution of high-purity lanthanum chloride was added dropwise at a speed of 1.5 L/min. During the dropwise addition, both the aqueous solution of high-purity lanthanum chloride and the aqueous solution of ammonium hydrogen carbonate were maintained at 32° C.

After the completion of the dropwise addition, the mixture was aged at 32° C. for 48 hours, then filtered, and washed with water 6 times, giving a $La_2O_3$ precursor. The resulting $La_2O_3$ precursor was calcined in the atmosphere at 1,200° C. for 5 hours and then was pulverized to give a material powder.

The powder had a BET specific surface area of 10.8 $m^2/g$ and an average particle size (secondary particle size) of 0.18 μm by laser scattering. Aggregated particles having a size of 2 μm or more were not observed.

Example 4: Ce:(Y,Gd)AG+Scattering Source $La_2O_3$

Molding and burning were performed in the same manner as in Example 2 except that the light-scattering agent ($La_2O_3$) prepared in Example 3 was used in place of the light-scattering agent in Example 2, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained the irregular colors/variation in color can be certainly improved.

Example 5: Ce:YAG+Scattering Source LAP

Molding and burning were performed in the same manner as in Example 1 except that the volume ratio of the Ce:YAG material powder to the LAP material powder was changed to 95:5, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance.

The results ascertained that the irregular colors/variation in color can be certainly improved.

Example 6: Ce:(Y,Gd)AG+Scattering Source LAP

Molding and burning were performed in the same manner as in Example 2 except that the volume ratio of the Ce:(Y,Gd)AG material powder to the LAP material powder was changed to 95:5, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 7: Ce:YAG+Scattering Source $La_2O_3$

Molding and burning were performed in the same manner as in Example 3 except that the volume ratio of the Ce:YAG material powder to the $La_2O_3$ material powder was changed to 95:5, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 8: Ce:(Y,Gd)AG+Scattering Source $La_2O_3$

Molding and burning were performed in the same manner as in Example 4 except that the volume ratio of the Ce:(Y,Gd)AG material powder to the $La_2O_3$ material powder was changed to 95:5, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 9: Ce:YAG+Scattering Source LAP

Molding and burning were performed in the same manner as in Example 1 except that the volume ratio of the Ce:YAG material powder to the LAP material powder was changed to 90:10, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 10: Ce:(Y,Gd)AG+Scattering Source LAP

Molding and burning were performed in the same manner as in Example 2 except that the volume ratio of the Ce:(Y,Gd)AG material powder to the LAP material powder was changed to 90:10, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 11: Ce:YAG+Scattering Source $La_2O_3$

Molding and burning were performed in the same manner as in Example 3 except that the volume ratio of the Ce:YAG material powder to the $La_2O_3$ material powder was changed to 90:10, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 12: Ce:(Y,Gd)AG+Scattering Source $La_2O_3$

Molding and burning were performed in the same manner as in Example 4 except that the volume ratio of the Ce:(Y,Gd)AG material powder to the $La_2O_3$ material powder was changed to 90:10. giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 13: Ce:YAG+Scattering Source LAP

Molding and burning were performed in the same manner as in Example 1 except that the volume ratio of the Ce:YAG material powder to the LAP material powder was changed to 99.9:0.1, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 14: Ce:(Y,Gd)AG+Scattering Source LAP

Molding and burning were performed in the same manner as in Example 2 except that the volume ratio of the Ce:(Y,Gd)AG material powder to the LAP material powder was changed to 99.9:0.1, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 15: Ce:YAG+Scattering Source LAP

Molding and burning were performed in the same manner as in Example 1 except that the volume ratio of the Ce:YAG material powder to the LAP material powder was changed to 99.8:0.2, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 16: Ce:(Y,Gd)AG+Scattering Source LAP

Molding and burning were performed in the same manner as in Example 2 except that the volume ratio of the Ce:(Y, Gd)AG material powder to the LAP material powder was changed to 99.8:0.2, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 17: Ce:YAG+Scattering Source LAP

Molding and burning were performed in the same manner as in Example 1 except that the volume ratio of the Ce:YAG material powder to the LAP material powder was changed to 99.5:0.5, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 18: Ce:(Y,Gd)AG+Scattering Source LAP

Molding and burning were performed in the same manner as in Example 2 except that the volume ratio of the Ce:(Y, Gd)AG material powder to the LAP material powder was changed to 99.5:0.5, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 19: Ce:YAG+Scattering Source LAP

Molding and burning were performed in the same manner as in Example 1 except that the volume ratio of the Ce:YAG material powder to the LAP material powder was changed to 99.0:1.0, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 20: Ce:(Y,Gd)AG+Scattering Source LAP

Molding and burning were performed in the same manner as in Example 2 except that the volume ratio of the Ce:(Y, Gd)AG material powder to the LAP material powder was changed to 99.0:1.0, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 21: Ce:YAG+Scattering Source LAP

Molding and burning were performed in the same manner as in Example 1 except that the volume ratio of the Ce:YAG material powder to the LAP material powder was changed to 98.0:2.0, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 22: Ce:(Y,Gd)AG+Scattering Source LAP

Molding and burning were performed in the same manner as in Example 2 except that the volume ratio of the Ce:(Y, Gd)AG material powder to the LAP material powder was changed to 98.0:2.0, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 23: Ce:YAG+Scattering Source LAP

Molding and burning were performed in the same manner as in Example 1 except that the volume ratio of the Ce:YAG material powder to the LAP material powder was changed to 96.5:3.5, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Example 24: Ce:(Y,Gd)AG+Scattering Source LAP

Molding and burning were performed in the same manner as in Example 2 except that the volume ratio of the Ce:(Y,Gd)AG material powder to the LAP material powder was changed to 96.5:3.5, giving a sintered compact (ceramic).

In the resulting sintered compact, as with Example 1, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Comparative Example 1: Ce:YAG without Scattering Source

Molding and burning were performed in the same manner as in Example 1 except that the light scattering source in Example 1 was not used, giving a sintered compact (ceramic).

Comparative Example 2: Ce:(Y,Gd)AG without Scattering Source

Molding and burning were performed in the same manner as in Example 1 except that the light scattering source in Example 2 was not used, giving a sintered compact (ceramic).

Reference Example 1: Ce:YAG+YAP

Molding and burning were performed in the same manner as in Example 1 except that YAP prepared by the following method was used in place of the light-scattering agent (LAP) in Example 1, giving a sintered compact (ceramic).
YAP First, 15 L of a 0.5 mol/L aqueous solution of high-purity yttrium chloride and 15 L of a 0.5 mol/L aqueous solution of high-purity aluminum chloride were mixed to give a mixed solution having a YAP ($YAlO_3$) composition formula.

Into 40 L of a 2 mol/L aqueous solution of ammonium hydrogen carbonate adjusted with an aqueous ammonia to have a pH of 8.2, the mixed solution having the YAP composition formula was added dropwise at a speed of 1.5 L/min. During the dropwise addition, both the mixed solution having the YAP composition formula and the aqueous solution of ammonium hydrogen carbonate were maintained at 32° C.

After the completion of the dropwise addition, the mixture was aged at 32° C. for 48 hours, then filtered, and washed with water 6 times, giving a YAP precursor. The resulting YAP precursor was calcined in the atmosphere at 1,200° C. for 5 hours and then was pulverized to give a material powder.

The powder had a BET specific surface area of 12.8 $m^2$/g and an average particle size (secondary particle size) of 0.22 μm by laser scattering. Aggregated particles having a size of 2 μm or more were not observed.

Reference Example 2: Ce:(Y,Gd)AG+YAP

Molding and burning were performed in the same manner as in Example 2 except that YAP prepared in Reference Example 1 was used in place of the light-scattering agent (LAP) in Example 2, giving a sintered compact (ceramic).

Reference Example 3: Ce:YAG+YAP

Molding and burning were performed in the same manner as in Reference Example 1 except that the volume ratio of the Ce:YAG material powder to the YAP material powder in Reference Example 1 was changed to 95:5, giving a sintered compact (ceramic).

Reference Example 4: Ce:(Y,Gd)AG+YAP

Molding and burning were performed in the same manner as in Reference Example 2 except that the volume ratio of the Ce:(Y,Gd)AG material powder to the YAP material powder in Reference Example 2 was changed to 95:5, giving a sintered compact (ceramic).

Reference Example 5: Ce:YAG+YAP

Molding and burning were performed in the same manner as in Reference Example 1 except that the volume ratio of the Ce:YAG material powder to the YAP material powder in Reference Example 1 was changed to 90:10, giving a sintered compact (ceramic).

Reference Example 6: Ce:(Y,Gd)AG+YAP

Molding and burning were performed in the same manner as in Reference Example 2 except that the volume ratio of the Ce:(Y,Gd)AG material powder to the YAP material powder in Reference Example 2 was changed to 90:10, giving a sintered compact (ceramic).

Reference Example 7: Ce:YAG+YAP

Molding and burning were performed in the same manner as in Reference Example 1 except that the volume ratio of the Ce:YAG material powder to the YAP material powder in Reference Example 1 was changed to 98.0:2.0, giving a sintered compact (ceramic).

Reference Example 8: Ce:(Y,Gd)AG+YAP

Molding and burning were performed in the same manner as in Reference Example 2 except that the volume ratio of the Ce:(Y,Gd)AG material powder to the YAP material powder in Reference Example 2 was changed to 98.0:2.0, giving a sintered compact (ceramic).

The crystal phase of each sintered compact (ceramic) produced in Examples, Comparative Examples, and Reference Examples was observed, and the linear transmission rate, the average particle size, and the internal quantum efficiency thereof were determined.

The results are shown in Table 1, Table 2, and Table 3.

TABLE 1

| | Fluorescent material (Ce, Gd, Y)$_3$Al$_5$O$_{12}$ | | | | | Light-scattering agent | | | Fluorescent |
|---|---|---|---|---|---|---|---|---|---|
| | Ce (mol %) | Cd mol %) | Y (mol %) | Specific Surface Area (m$^2$/g) | Average size (μm) | Type | Specific Surface Area (m$^2$/g) | Average size (μm) | material/light-scattering agent (volume ratio) |
| Example 1 | 0.15 | 0.00 | 99.85 | 12.2 | 0.26 | LAP | 11.9 | 0.20 | 80/20 |
| Example 2 | 0.15 | 7.00 | 92.85 | 11.6 | 0.28 | LAP | 11.9 | 0.20 | 80/20 |
| Example 3 | 0.15 | 0.00 | 99.85 | 12.2 | 0.26 | La$_2$O$_3$ | 10.8 | 0.18 | 80/20 |
| Example 4 | 0.15 | 7.00 | 92.85 | 11.6 | 0.28 | La$_2$O$_3$ | 10.8 | 0.18 | 80/20 |
| Example 5 | 0.15 | 0.00 | 99.85 | 12.2 | 0.26 | LAP | 11.9 | 0.20 | 95/5 |
| Example 6 | 0.15 | 7.00 | 92.85 | 11.6 | 0.28 | LAP | 11.9 | 0.20 | 95/5 |
| Example 7 | 0.15 | 0.00 | 99.85 | 12.2 | 0.26 | La$_2$O$_3$ | 10.8 | 0.18 | 95/5 |
| Example 8 | 0.15 | 7.00 | 92.85 | 11.6 | 0.28 | La$_2$O$_3$ | 10.8 | 0.18 | 95/5 |
| Example 9 | 0.15 | 0.00 | 99.85 | 12.2 | 0.26 | LAP | 11.9 | 0.20 | 90/10 |
| Example 10 | 0.15 | 7.00 | 92.85 | 11.6 | 0.28 | LAP | 11.9 | 0.20 | 90/10 |
| Example 11 | 0.15 | 0.00 | 99.85 | 12.2 | 0.26 | La$_2$O$_3$ | 10.8 | 0.18 | 90/10 |
| Example 12 | 0.15 | 7.00 | 92.85 | 11.6 | 0.28 | La$_2$O$_3$ | 10.8 | 0.18 | 90/10 |

| | Sintered compact (ceramic) | | | | |
|---|---|---|---|---|---|
| | Crystal phase | Average size (μm) | Linear transmission rate (%) | Main fluorescence wavelength (μm) | Internal quantum efficiency (%) |
| Example 1 | Two-phase YAG/LAP | YAG phase: 3.0 LAP phase: 1.4 | 0.29 | 537 | 97.5 |
| Example 2 | Two-phase YAG/LAP | YAG phase: 3.5 LAP phase: 1.6 | 0.22 | 560 | 96.3 |
| Example 3 | Two-phase YAG/La$_2$O$_3$ | YAG phase: 3.1 La$_2$O$_3$ phase: 1.0 | 0.25 | 537 | 97.2 |
| Example 4 | Two-phase YAG/La$_2$O$_3$ | YAG phase: 3.3 La$_2$O$_3$ phase: 1.2 | 0.19 | 560 | 96.4 |
| Example 5 | Two-phase YAG/LAP | YAG phase: 2.8 LAP phase: 1.4 | 0.30 | 537 | 97.8 |
| Example 6 | Two-phase YAG/LAP | YAG phase: 3.1 LAP phase: 1.2 | 0.31 | 560 | 96.9 |
| Example 7 | Two-phase YAG/La$_2$O$_3$ | YAG phase: 3.0 La$_2$O$_3$ phase: 1.1 | 0.29 | 537 | 97.5 |
| Example 8 | Two-phase YAG/La$_2$O$_3$ | YAG phase: 3.8 La$_2$O$_3$ phase: 1.6 | 0.30 | 560 | 96.7 |
| Example 9 | Two-phase YAG/LAP | YAG phase: 3.2 LAP phase: 1.3 | 0.28 | 537 | 97.6 |
| Example 10 | Two-phase YAG/LAP | YAG phase: 3.5 LAP phase: 1.2 | 0.27 | 560 | 96.8 |
| Example 11 | Two-phase YAG/La$_2$O$_3$ | YAG phase: 3.1 La$_2$O$_3$ phase: 1.4 | 0.28 | 537 | 97.5 |
| Example 12 | Two-phase YAG/La$_2$O$_3$ | YAG phase: 3.6 La$_2$O$_3$ phase: 1.6 | 0.28 | 560 | 96.8 |

TABLE 2

| | Fluorescent material (Ce, Gd, Y)$_3$Al$_5$O$_{12}$ | | | | | Light-scattering agent | | | Fluorescent material/light-scattering agent (volume ratio) |
|---|---|---|---|---|---|---|---|---|---|
| | Ce (mol %) | Cd mol % | Y (mol %) | Specific Surface Area (m$^2$/g) | Average size (μm) | Type | Specific Surface Area (m$^2$/g) | Average size (μm) | |
| Example 13 | 0.15 | 0.00 | 99.85 | 12.2 | 0.26 | LAP | 11.9 | 0.20 | 99.9/0.1 |
| Example 14 | 0.15 | 7.00 | 92.85 | 11.6 | 0.28 | LAP | 11.9 | 0.20 | 99.9/0.1 |
| Example 15 | 0.15 | 0.00 | 99.85 | 12.2 | 0.26 | LAP | 11.9 | 0.20 | 99.8/0.2 |
| Example 16 | 0.15 | 7.00 | 92.85 | 11.6 | 0.28 | LAP | 11.9 | 0.20 | 99.8/0.2 |
| Example 17 | 0.15 | 0.00 | 99.85 | 12.2 | 0.26 | LAP | 11.9 | 0.20 | 99.5/0.5 |
| Example 18 | 0.15 | 7.00 | 92.85 | 11.6 | 0.28 | LAP | 11.9 | 0.20 | 99.5/0.5 |
| Example 19 | 0.15 | 0.00 | 99.85 | 12.2 | 0.26 | LAP | 11.9 | 0.20 | 99.0/1.0 |
| Example 20 | 0.15 | 7.00 | 92.85 | 11.6 | 0.28 | LAP | 11.9 | 0.20 | 99.0/1.0 |
| Example 21 | 0.15 | 0.00 | 99.85 | 12.2 | 0.26 | LAP | 11.9 | 0.20 | 98.0/2.0 |
| Example 22 | 0.15 | 7.00 | 92.85 | 11.6 | 0.28 | LAP | 11.9 | 0.20 | 98.0/2.0 |
| Example 23 | 0.15 | 0.00 | 99.85 | 12.2 | 0.26 | LAP | 11.9 | 0.20 | 96.5/3.5 |
| Example 24 | 0.15 | 7.00 | 92.85 | 11.6 | 0.28 | LAP | 11.9 | 0.20 | 96.5/3.5 |

| | Sintered compact (ceramic) | | | | |
|---|---|---|---|---|---|
| | Crystal phase | Average size (μm) | Linear transmission rate (%) | Main fluorescence wavelength (μm) | Internal quantum efficiency (%) |
| Example 13 | Two-phase YAG/LAP | YAG phase: 3.2 LAP phase: 1.2 | 3.10 | 537 | 97.1 |
| Example 14 | Two-phase YAG/LAP | YAG phase: 3.0 LAP phase: 1.4 | 2.94 | 560 | 96.4 |
| Example 15 | Two-phase YAG/LAP | YAG phase: 3.3 LAP phase: 1.3 | 2.97 | 537 | 97.2 |
| Example 16 | Two-phase YAG/LAP | YAG phase: 3.5 LAP phase: 1.6 | 2.75 | 560 | 96.6 |
| Example 17 | Two-phase YAG/LAP | YAG phase: 3.7 LAP phase: 1.1 | 1.21 | 537 | 97.4 |
| Example 18 | Two-phase YAG/LAP | YAG phase: 3.2 LAP phase: 1.4 | 0.97 | 560 | 96.7 |
| Example 19 | Two-phase YAG/LAP | YAG phase: 3.3 LAP phase: 1.1 | 0.59 | 537 | 97.7 |
| Example 20 | Two-phase YAG/LAP | YAG phase: 3.2 LAP phase: 1.4 | 0.44 | 560 | 96.8 |
| Example 21 | Two-phase YAG/LAP | YAG phase: 3.3 LAP phase: 1.2 | 0.28 | 537 | 97.9 |
| Example 22 | Two-phase YAG/LAP | YAG phase: 3.5 LAP phase: 1.5 | 0.27 | 560 | 97.0 |
| Example 23 | Two-phase YAG/LAP | YAG phase: 3.5 LAP phase: 1.5 | 0.28 | 537 | 97.6 |
| Example 24 | Two-phase YAG/LAP | YAG phase: 3.3 LAP phase: 1.4 | 0.27 | 560 | 96.9 |

TABLE 3

| | Fluorescent material (Ce, Gd, Y)$_3$Al$_5$O$_{12}$ | | | | | Light-scattering agent | | | Fluorescent material/light-scattering agent (volume ratio) |
|---|---|---|---|---|---|---|---|---|---|
| | Ce (mol %) | Cd mol % | Y (mol %) | Specific Surface Area (m$^2$/g) | Average size (μm) | Type | Specific Surface Area (m$^2$/g) | Average size (μm) | |
| Comparative Example 1 | 0.15 | 0.00 | 99.85 | 12.2 | 0.26 | — | — | — | 100.0/0.0 |
| Comparative Example 2 | 0.15 | 7.00 | 92.85 | 11.6 | 0.28 | — | — | — | 100.0/0.0 |
| Reference Example 1 | 0.15 | 0.00 | 99.85 | 12.2 | 0.26 | YAP | 12.8 | 0.22 | 80.0/20.0 |
| Reference Example 2 | 0.15 | 7.00 | 92.85 | 11.6 | 0.28 | YAP | 12.8 | 0.22 | 80.0/20.0 |
| Reference Example 3 | 0.15 | 0.00 | 99.85 | 12.2 | 0.26 | YAP | 12.8 | 0.22 | 95.0/5.0 |
| Reference Example 4 | 0.15 | 7.00 | 92.85 | 11.6 | 0.28 | YAP | 12.8 | 0.22 | 95.0/5.0 |
| Reference Example 5 | 0.15 | 0.00 | 99.85 | 12.2 | 0.26 | YAP | 12.8 | 0.22 | 90.0/10.0 |

TABLE 3-continued

| | | | | | | | | | |
|---|---|---|---|---|---|---|---|---|---|
| Reference Example 6 | 0.15 | 7.00 | 92.85 | 11.6 | 0.28 | YAP | 12.8 | 0.22 | 90.0/10.0 |
| Reference Example 7 | 0.15 | 0.00 | 99.85 | 12.2 | 0.26 | YAP | 12.8 | 0.22 | 98.0/2.0 |
| Reference Example 8 | 0.15 | 7.00 | 92.85 | 11.6 | 0.28 | YAP | 12.8 | 0.22 | 98.0/2.0 |

| | Sintered compact (ceramic) | | | | |
|---|---|---|---|---|---|
| | Crystal phase | Average size ($\mu$m) | Linear transmission rate (%) | Main fluorescence wavelength ($\mu$m) | Internal quantum efficiency (%) |
| Comparative Example 1 | Single-phase YAG | YAG phase: 2.8 | 82.4 | 537 | 97.1 |
| Comparative Example 2 | Single-phase YAG | YAG phase: 3.1 | 81.1 | 560 | 95.9 |
| Reference Example 1 | Two-phase YAG/YAP | YAG phase: 3.2 LAP phase: 1.3 | 0.25 | 528 | 87.5 |
| Reference Example 2 | Two-phase YAG/YAP | YAG phase: 3.8 LAP phase: 1.9 | 0.23 | 551 | 85.9 |
| Reference Example 3 | Two-phase YAG/YAP | YAG phase: 3.1 LAP phase: 1.3 | 0.30 | 528 | 89.8 |
| Reference Example 4 | Two-phase YAG/YAP | YAG phase: 3.2 LAP phase: 1.7 | 0.23 | 551 | 86.4 |
| Reference Example 5 | Two-phase YAG/YAP | YAG phase: 3.2 LAP phase: 1.5 | 0.26 | 528 | 89.0 |
| Reference Example 6 | Two-phase YAG/YAP | YAG phase: 3.6 LAP phase: 1.3 | 0.29 | 551 | 86.1 |
| Reference Example 7 | Two-phase YAG/YAP | YAG phase: 3.2 LAP phase: 1.5 | 0.53 | 528 | 89.4 |
| Reference Example 8 | Two-phase YAG/YAP | YAG phase: 3.6 LAP phase: 1.3 | 0.48 | 551 | 86.2 |

The above results in the tables indicate that the lanthanum oxide formed a multiphase structure in combination with a fluorescent material and functioned as a light-scattering agent (a low linear transmission rate).

In addition, use of the lanthanum oxide caused no change in main fluorescence wavelength, surprisingly. It was thus revealed that use of the lanthanum oxide can provide an intended fluorescence wavelength.

Surprisingly, it was also revealed that even when the lanthanum oxide was used in combination, the internal quantum efficiency was equal to or more than the original value, and the luminous efficiency was maintained or improved.

In addition, even when the type (composition formula) of the fluorescent material (garnet phase) was changed, the resulting ceramic functioned as a light-scattering agent as with the above examples, had substantially the same main fluorescence wavelength, and exhibited an equal or higher internal quantum efficiency.

Specifically, the fluorescent material in Examples 1, 3, 5, 7, 9, and 11 was changed to the fluorescent materials shown in A1 to A4 in Table 4, and the fluorescent material in Examples 2, 4, 6, 8, 10, and 12 was changed to the fluorescent materials in B1 to B4 shown in Table 4. The resulting sintered compacts (ceramics) were evaluated.

TABLE 4

| | Fluorescent material $(Ce, Gd, Y)_3Al_5O_{12}$ | | |
|---|---|---|---|
| | Ce (mol %) | Cd mol % | Y (mol %) |
| A-1 | 0.10 | 0.00 | 99.90 |
| A-2 | 0.20 | 0.00 | 99.80 |
| A-3 | 0.50 | 0.00 | 99.50 |
| A-4 | 0.90 | 0.00 | 99.10 |

TABLE 4-continued

| | Fluorescent material $(Ce, Gd, Y)_3Al_5O_{12}$ | | |
|---|---|---|---|
| | Ce (mol %) | Cd mol % | Y (mol %) |
| B-1 | 0.15 | 2.00 | 97.85 |
| B-2 | 0.15 | 5.00 | 94.85 |
| B-3 | 0.15 | 10.00 | 89.85 |
| B-4 | 0.15 | 20.00 | 79.85 |

In each sintered compact, particles of micrometer order (single crystal grains) densely aggregated in the structure (the grain boundary width was less than 1 nm), pores were hardly observed, and no impurity was present on the grain boundary. Some of the crystal grains had a different contrast, which indicated that the sintered compact was composed of two different substances.

The resulting sintered compact was placed on a blue LED, and a luminance meter was used to compare luminance between the perpendicular direction and an angle of 45 degrees, resulting in substantially the same luminance. The results ascertained that the irregular colors/variation in color can be certainly improved.

Each sintered compact also had substantially the same linear transmission rate, main fluorescence wavelength, and internal quantum efficiency as in Table 1.

INDUSTRIAL APPLICABILITY

According to the present invention, a novel light-scattering agent and a ceramic composition can be produced.

The invention claimed is:
1. A ceramic composition comprising:
a fluorescence phase comprising a fluorescent material; and
a light-scattering phase comprising a lanthanum oxide, wherein the fluorescent material comprises a garnet structure, the lanthanum oxide comprises LaAlO$_3$ or La$_2$O$_3$ at 50% by mass or more relative to a total amount of the lanthanum oxide, the average particle size in the light-scattering phase is 1 μm or more, and said ceramic composition has a linear transmission rate of 5% or less at a thickness of 2 mm and at a wavelength of 530 nm.

2. The ceramic composition according to claim 1, wherein the lanthanum oxide comprises LaAlO$_3$ or La$_2$O$_3$ at 95% by mass or more relative to a total amount of the lanthanum oxide.

3. The ceramic composition according to claim 1, wherein the ratio of average particle size in the fluorescence phase to average particle size in the light-scattering phase is 100/1 to 1/1.

4. The ceramic composition according to claim 1, wherein the ratio of the fluorescent material to the lanthanum oxide is 99.9/0.1 to 50/50 with respect to the volume ratio.

5. The ceramic composition according to claim 1, wherein
the ceramic composition comprises a fluorescence phase comprising a fluorescent material containing an yttrium garnet compound doped with an activator and further comprises a light-scattering phase comprising a lanthanum oxide containing at LaAlO$_3$ or La$_2$O$_3$ at 80% by mass or more relative to a total amount of the lanthanum oxide,
the ratio of the fluorescent material to the lanthanum oxide is 99.9/0.1 to 70/30 with respect to the volume ratio, and
the ratio of average particle size in the fluorescence phase to average particle size in the light-scattering phase is 15/1 to 1.2/1.

6. The ceramic composition according to claim 1, wherein said ceramic composition has a linear transmission rate of 1% or less at a thickness of 2 mm and at a wavelength of 530 nm.

7. The ceramic composition according to claim 1, wherein said ceramic composition has a difference in main fluorescence wavelength, A2−A1, of −5 nm to 5 nm, where A1 is a main fluorescence wavelength without the lanthanum oxide, and A2 is a main fluorescence wavelength with the lanthanum oxide.

8. The ceramic composition according to claim 1, wherein said ceramic composition has an internal quantum efficiency ratio, B2/B1, of 0.93 or more, where B1 is an internal quantum efficiency without the lanthanum oxide, and B2 is an internal quantum efficiency with the lanthanum oxide.

9. The ceramic composition according to claim 1, wherein said ceramic composition comprises:
a linear transmission rate of 3.5% or less at a thickness of 2 mm and at a wavelength of 530 nm,
a difference in main fluorescence wavelength, A2−A1, of −3 nm to 3 nm, where A1 is a main fluorescence wavelength without the lanthanum oxide, and A2 is a main fluorescence wavelength with the lanthanum oxide, and
an internal quantum efficiency ratio, B2/B1, of 0.95 or more, where B1 is an internal quantum efficiency without the lanthanum oxide, and B2 is an internal quantum efficiency with the lanthanum oxide.

10. A light-emitting device comprising:
a light-emitting element; and
the ceramic composition according to claim 1.

11. The ceramic composition according to claim 1, wherein the average particle size in the fluorescence phase is 1 μm or more.

* * * * *

UNITED STATES PATENT AND TRADEMARK OFFICE
CERTIFICATE OF CORRECTION

PATENT NO. : 10,800,967 B2  
APPLICATION NO. : 16/466260  
DATED : October 13, 2020  
INVENTOR(S) : Takagimi Yanagitani et al.

Page 1 of 1

It is certified that error appears in the above-identified patent and that said Letters Patent is hereby corrected as shown below:

On the Title Page

In Column 2, Item (74), Line 1, under Attorney, Agent or Firm, delete "Knobbe," and insert --Knobbe--.

In the Specification

In Column 5, Line 4, delete "g)" and insert --g).--.

In Column 12, Line 47, delete "factor)" and insert --factor).--.

In Column 23, Line 21 (Approx.), table 1, delete "mol %)" and insert --(mol %)--.

In Column 25, Line 5 (Approx.), table 2, delete "mol %)" and insert --(mol %)--.

In Column 25, Line 53 (Approx.), table 3, delete "mol %)" and insert --(mol %)--.

In Column 27, Line 62 (Approx.), table 4, delete "mol %)" and insert --(mol %)--.

In Column 28, Line 36 (Approx.), table 4, delete "mol %)" and insert --(mol %)--.

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*